(12) United States Patent
Baloukas et al.

(10) Patent No.: US 11,072,558 B2
(45) Date of Patent: Jul. 27, 2021

(54) GLASS, GLASS-CERAMIC AND CERAMIC ARTICLES WITH PROTECTIVE COATINGS HAVING HARDNESS AND TOUGHNESS

(71) Applicants: Corning Incorporated, Corning, NY (US); La Corporation de l'Ecole Polytechnique de Montreal, Montréal (CA)

(72) Inventors: Bill Baloukas, Montreal (CA); Robert Alan Bellman, Ithaca, NY (US); Shandon Dee Hart, Elmira, NY (US); Karl William Koch, III, Elmira, NY (US); Carlo Anthony Kosik Williams, Painted Post, NY (US); Ludvik Martinu, Montreal (CA); Charles Andrew Paulson, Painted Post, NY (US); James Joseph Price, Corning, NY (US); Jincheng Qian, Montreal (CA)

(73) Assignees: Corning Incorporated, Corning, NY (US); La Corporation de l'Ecole Polytechnique de Montreal, Quebec (CA)

(*) Notice: Subject to any disclaimer, the term of this patent is extended or adjusted under 35 U.S.C. 154(b) by 0 days.

(21) Appl. No.: 16/690,499

(22) Filed: Nov. 21, 2019

(65) Prior Publication Data

US 2020/0156992 A1    May 21, 2020

Related U.S. Application Data

(60) Provisional application No. 62/770,444, filed on Nov. 21, 2018.

(51) Int. Cl.
*B32B 15/04* (2006.01)
*B32B 17/06* (2006.01)
(Continued)

(52) U.S. Cl.
CPC ......... *C03C 17/245* (2013.01); *H05K 5/0017* (2013.01); *H05K 5/03* (2013.01);
(Continued)

(58) Field of Classification Search
CPC ... C03C 2217/78; C03C 17/366; C03C 3/085; C03C 3/093; C03C 17/3417;
(Continued)

(56) References Cited

U.S. PATENT DOCUMENTS 6,077,569 A    6/2000    Knapp et al.
2014/0131091 A1*    5/2014    Smith ............... C03C 17/23
                                                174/565

(Continued)

FOREIGN PATENT DOCUMENTS

WO    2016/033138 A1    3/2016
WO    2018/144554 A1    8/2018

OTHER PUBLICATIONS

Chan et. al., "Fracture toughness improvements of dental ceramic through use of yttria-stabilized zirconia (YSZ) thin-film coatings", Dental Materials, vol. 29, Issue 8, Aug. 2013, pp. 881887.
Fischer-Cripps, A.C., "Critical Review of Analysis and Interpretation of Nanoindentation Test Data," Surface & Coatings Technology, 200, 4153 4165 (2006.
Harding et al., "Cracking During Nanoindentation and its Use in the Measurement of Fracture Toughness," Mat. Res. Soc. Symp. Proc., vol. 356, 1995, 663-668.
(Continued)

*Primary Examiner* — Lauren R Colgan

(57) ABSTRACT

An article includes: a transparent substrate having a primary surface; and a protective film disposed on the primary surface, such that each of the substrate and the protective film have an optical transmittance of 20% or more in the visible spectrum, and such that the protective film includes at least one of: (1) a hardness of greater than 13 GPa, as
(Continued)

measured by a Berkovich nanoindenter, or (2) an effective fracture toughness (Kc) of greater than 2.5 MPa·m$^{1/2}$, as measured by indentation fracture at a depth of greater than 1 μm.

20 Claims, 3 Drawing Sheets

(51) Int. Cl.
  *C03C 17/245* (2006.01)
  *H05K 5/00* (2006.01)
  *H05K 5/03* (2006.01)
(52) U.S. Cl.
  CPC ...... *C03C 2217/22* (2013.01); *C03C 2217/78* (2013.01); *C03C 2218/155* (2013.01)
(58) Field of Classification Search
  CPC ............ C03C 17/3618; C03C 17/3626; C03C 2217/22; C03C 2217/48; C03C 2217/70; C03C 2217/73; B32B 17/06; B32B 2307/412; B32B 2250/02; B32B 2255/20; B32B 2457/00; B32B 2457/208; B32B 17/00; B32B 2264/102; B32B 2307/54; B32B 2307/558; B32B 17/10018; G02B 1/14; Y10T 428/315; Y10T 428/265; Y10T 428/12611; Y10T 428/24975; Y10T 428/263
  USPC ........ 428/409, 410, 426, 428, 432, 701, 702
  See application file for complete search history.

(56) References Cited

U.S. PATENT DOCUMENTS

| | | |
|---|---|---|
| 2014/0335330 A1 | 11/2014 | Bellman et al. |
| 2014/0376094 A1* | 12/2014 | Bellman ............ C03C 17/3435 359/580 |
| 2016/0060161 A1 | 3/2016 | Ellison et al. |
| 2016/0076135 A1 | 3/2016 | Cheah et al. |
| 2018/0275318 A1 | 9/2018 | Amin et al. |
| 2019/0337841 A1* | 11/2019 | Hart ...................... C23C 14/08 |
| 2019/0352226 A1 | 11/2019 | Harris et al. |

OTHER PUBLICATIONS

Hay et al., "Continuous Stiffness measurement During Instrumented Indentation Testing," Experimental Techniques, 34 (3) 86 94 (2010.
Hu, G., et al., "Dynamic fracturing of strengthened glass under biaxial tensile loading," Journal of Non-Crystalline Solids, 2014. 405(0): p. 153-158.
Jang & Pharr, "Influence of indenter angle on cracking in Si and Ge during nanoindentation." Acta Materiala 2008, 56, 4458-4469.
Kittel, "Introduction to Solid State Physics," seventh edition, John Wiley & Sons, Inc., NY, 1996, pp. 611-627.
Lawn & Cook, "Probing material properties with sharp indenters: a retrospective." Journal of Material Science 2012, 47, 1-22.
Oliver & Pharr, "An improved technique for determining hardness and elastic modulus using load and displacement sensing indentation experiments." J. Mater. Res. 1992,7, 1564-1583.
Oliver & Pharr, "Measurement of hardness and elastic modulus by instrumented indentation: Advances in understanding and refinements to methodology." J. Mater. Res. 2004,19, 3-20.
Shackelford, "Introduction to Materials Science for Engineers," Sixth Edition, Pearson Prentice Hall, New Jersey, 2005, pp. 404-418.
Smart and Moore, "Solid State Chemistry, An Introduction," 1st edition, Chapman & Hall University and Professional Division, London, 1992, pp. 136-151.
Wang and Zhang, "Toward hard yet tough ceramic coatings," Surface & Coatings Technology, 258, p. 1-16 (2014).
Wong et al. "High-rate reactive d.c. magnetron sputtering of ZrO11x coatings," Surface and Coatings Technology (86-87) 1996, pp. 381-387.
Invitation to Pay Additional Fees From the International Searching Aurthority; PCT/US2019/061603; dated Feb. 21, 2020; 13 Pages; European Patent Office.

* cited by examiner

GLASS, GLASS-CERAMIC AND CERAMIC ARTICLES WITH PROTECTIVE COATINGS HAVING HARDNESS AND TOUGHNESS

This application claims the benefit of priority under 35 U.S.C. § 119 of U.S. Provisional Application Ser. No. 62/770,444 filed on Nov. 21, 2018, the content of which is relied upon and incorporated herein by reference in its entirety.

FIELD

The present disclosure generally relates to glass, glass-ceramic and ceramic articles with protective films and coatings having a high hardness and toughness, particularly, transparent protective coatings and films with a combination of hardness and toughness.

BACKGROUND

Glass, glass-ceramic and ceramic materials, many of which are configured or otherwise processed with various strength-enhancing features, are prevalent in various displays and display devices of many consumer electronic products. For example, chemically strengthened glass is favored for many touch-screen products, including cell phones, music players, e-book readers, notepads, tablets, laptop computers, automatic teller machines, and other similar devices. Many of these glass, glass-ceramic and ceramic materials are also employed in displays and display devices of consumer electronic products that do not have touch-screen capability, but are prone to mechanical contact, including desktop computers, laptop computers, elevator screens, equipment displays, and others.

Glass, glass-ceramic and ceramic materials, as processed in some cases with strength-enhancing features, are also prevalent in various applications desiring display- and/or optic-related functionality and demanding mechanical property considerations. For example, these materials can be employed as cover lenses, substrates and housings for watches, smartphones, retail scanners, eyeglasses, eyeglass-based displays, outdoor displays, automotive displays and other related applications. These materials can also be employed in vehicular windshields, vehicular windows, vehicular moon-roof, sun-roof and panoramic roof elements, architectural glass, residential and commercial windows, and other similar applications.

As used in these display and related applications, these glass, glass-ceramic and ceramic materials are often coated with transparent and semi-transparent, scratch-resistant films to increase wear resistance and resist the development of mechanically-induced defects that can otherwise lead to premature failure. These conventional scratch-resistant coatings and films, however, are often prone to low strain-to-failure. As a result, the articles employing these films can be characterized by good wear resistance, but also by lack of benefit in terms of flexural strength, drop resistance and/or toughness. Furthermore, the relatively low strain-to-failure of the conventional scratch-resistant films and coatings can contribute to higher scratch visibility through "frictive cracking" and "chatter cracking" mechanisms, generally associated with the brittleness of these films and coatings.

In view of these considerations, there is a need for glass, glass-ceramic and ceramic articles with protective films and coatings having a high hardness and toughness, particularly, transparent protective coatings and films with a combination of high hardness and toughness.

SUMMARY

In some embodiments, an article comprises: a transparent substrate comprising a primary surface; and a protective film disposed on the primary surface, wherein the protective film comprises at least one of: (1) a hardness of greater than 13 GPa, as measured by a Berkovich nanoindenter, (2) an effective fracture toughness (Kc) of greater than 2.5 MPa·m$^{1/2}$, or (3) an optical extinction coefficient (k) equal to or less than $1\times10^{-2}$, measured at 400 nm wavelength.

In one aspect, which is combinable with any of the other aspects or embodiments, the protective film comprises a strain-to-failure of greater than 0.7%, as measured by a ring-on-ring test.

In one aspect, which is combinable with any of the other aspects or embodiments, the protective film comprises a thickness in a range of 1.0 μm to 50 μm.

In one aspect, which is combinable with any of the other aspects or embodiments, the protective film comprises both (1) and (2).

In one aspect, which is combinable with any of the other aspects or embodiments, the protective film comprises a compressive film stress greater than 50 MPa.

In one aspect, which is combinable with any of the other aspects or embodiments, the protective film comprises an optical transmittance of 50% or more in the visible spectrum.

In one aspect, which is combinable with any of the other aspects or embodiments, the protective film comprises a refractive index (n) of at least 2.0, measured at 550 nm wavelength.

In one aspect, which is combinable with any of the other aspects or embodiments, each of the substrate and the protective film comprises an optical transmittance of 20% or more in the visible spectrum.

In one aspect, which is combinable with any of the other aspects or embodiments, the protective film comprises a coating failure stress of greater than 800 MPa.

In one aspect, which is combinable with any of the other aspects or embodiments, the protective film comprises a composition having greater than 80% $ZrO_2$, by molar concentration or volume.

In one aspect, which is combinable with any of the other aspects or embodiments, the protective film comprises tetragonal $ZrO_2$, monoclinic $ZrO_2$, or a combination thereof.

In one aspect, which is combinable with any of the other aspects or embodiments, the protective film comprises an inorganic material, wherein the material is polycrystalline or semi-polycrystalline and comprises an average crystallite size of less than 1 micron.

In one aspect, which is combinable with any of the other aspects or embodiments, the substrate further comprises a compressive stress region, the compressive stress region extending from the primary surface to a first selected depth in the substrate.

In one aspect, which is combinable with any of the other aspects or embodiments, the protective film comprises a multilayer optical coating selected from at least one of: anti-reflective film, dielectric mirror film, infrared blocking film, ultraviolet blocking film, wavelength-selective band-pass film, or notch filter.

In one aspect, which is combinable with any of the other aspects or embodiments, the multilayer optical coating comprises at least one $ZrO_2$-based film having a refractive index of n1, and at least one lower refractive index material film having a refractive index of n2, wherein n1 is greater than n2.

In some embodiments, a consumer electronic product comprises: a housing comprising front, back and side surfaces; electrical components that are at least partially inside the housing; and a display at or adjacent to the front surface of the housing, wherein the article of claim 1 is at least one of disposed over the display and disposed as a portion of the housing.

In some embodiments, a vehicle display system comprises: a housing comprising front, back and side surfaces; electrical components that are at least partially inside the housing; and a display at or adjacent to the front surface of the housing, wherein the article of claim 1 is at least one of disposed over the display and disposed as a portion of the housing.

In some embodiments, a device comprises an article as described herein. In one aspect, which is combinable with any of the other aspects or embodiments, the device comprises a camera lens cover, an optical sensor cover, or an infrared (IR) sensor cover.

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the disclosure and the appended claims.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following embodiments.

According to a first aspect, an article is provided that includes: a substrate comprising a glass, glass-ceramic or a ceramic composition and a primary surface; and a protective film disposed on the primary surface. Each of the substrate and the film comprises an optical transmittance of 20% or more in the visible spectrum. Further, the protective film comprises a hardness of greater than 10 GPa, as measured by a Berkovich nanoindenter, and a strain-to-failure of greater than 0.8%, as measured by a ring-on-ring test.

According to a second aspect, the article of aspect 1 is provided, wherein the protective film comprises a thickness in the range from about 0.2 microns to about 10 microns.

According to a third aspect, the article of aspect 2 is provided, wherein the protective film comprises an inorganic material, wherein the material is polycrystalline or semi-polycrystalline and comprises an average crystallite size of less than 1 micron.

According to a fourth aspect, the article of aspect 3 is provided, wherein the inorganic material is selected from the group consisting of aluminum nitride, aluminum oxynitride, alumina, spinel, mullite, zirconia-toughened alumina, zirconia, stabilized zirconia, and partially-stabilized zirconia.

According to a fifth aspect, the article of aspect 3 is provided, wherein the inorganic material comprises a substantially isotropic, non-columnar microstructure, and further wherein a ratio of the thickness of the protective film to the average crystallite size of the material is 4× or greater.

According to a sixth aspect, the article of aspect 2 is provided, wherein the protective film comprises a yttria-stabilized tetragonal zirconia polycrystalline (Y-TZP) material.

According to a seventh aspect, the article of aspect 6 is provided, wherein the Y-TZP material comprises about 1 to 8 mol % yttria and greater than 1 mol % of tetragonal zirconia.

According to an eighth aspect, the article of aspect 1 or aspect 2 is provided, wherein the protective film comprises an energy-absorbing material comprising a plurality of microstructure defects, the energy-absorbing material selected from the group consisting of yttrium disilicate, boron suboxide, titanium silicon carbide, quartz, feldspar, amphibole, kyanite and pyroxene.

According to a ninth aspect, the article of any one of aspects 1-8 is provided, wherein the protective film comprises an optical transmittance of 50% or more in the visible spectrum, and further wherein the film comprises a hardness of greater than 14 GPa at an indentation depth of 100 nm or 500 nm, as measured by a Berkovich nanoindenter, and a strain-to-failure of greater than 1%, as measured by a ring-on-ring test.

According to a tenth aspect, the article of any one of aspects 1-9 is provided, wherein the protective film further comprises a compressive film stress of greater than 50 MPa.

According to an eleventh aspect, the article of any one of aspects 1-10 is provided, wherein the protective film comprises a hardness of greater than 16 GPa at an indentation depth of 100 nm to 500 nm, as measured by a Berkovich nanoindenter, and a strain-to-failure of greater than 1.6%, as measured by a ring-on-ring test.

According to a twelfth aspect, the article of any one of aspects 1-12 is provided, wherein the protective film further comprises a fracture toughness of greater than 1 MPa·m$^{1/2}$.

According to a thirteenth aspect, an article is provided that includes: a glass substrate comprising a primary surface and a compressive stress region, the compressive stress region extending from the primary surface to a first selected depth in the substrate; and a protective film disposed on the primary surface. Each of the substrate and the film comprises an optical transmittance of 20% or more in the visible spectrum. Further, the protective film comprises a hardness of greater than 10 GPa, as measured by a Berkovich nanoindenter, and a strain-to-failure of greater than 0.8%, as measured by a ring-on-ring test.

According to a fourteenth aspect, the article of aspect 13 is provided, wherein the protective film comprises a thickness in the range from about 0.2 microns to about 10 microns.

According to a fifteenth aspect, the article of aspect 14 is provided, wherein the protective film comprises an inorganic material, wherein the material is polycrystalline or semi-polycrystalline and comprises an average crystallite size of less than 1 micron.

According to a sixteenth aspect, the article of aspect 15 is provided, wherein the inorganic material is selected from the group consisting of aluminum nitride, aluminum oxynitride, alumina, spinel, mullite, zirconia-toughened alumina, zirconia, stabilized zirconia, and partially-stabilized zirconia.

According to a seventeenth aspect, the article of aspect 15 is provided, wherein the inorganic material comprises a substantially isotropic, non-columnar microstructure, and further wherein a ratio of the thickness of the protective film to the average crystallite size of the material is 4× or greater.

According to an eighteenth aspect, the article of aspect 14 is provided, wherein the protective film comprises a yttria-stabilized tetragonal zirconia polycrystalline (Y-TZP) material.

According to a nineteenth aspect, the article of aspect 18 is provided, wherein the Y-TZP material comprises about 1 to 8 mol % yttria and greater than 1 mol % of tetragonal zirconia.

According to a twentieth aspect, the article of aspect 13 or aspect 14 is provided, wherein the protective film comprises an energy-absorbing material comprising a plurality of microstructure defects, the energy-absorbing material selected from the group consisting of yttrium disilicate, boron suboxide, titanium silicon carbide, quartz, feldspar, amphibole, kyanite and pyroxene.

According to a twenty-first aspect, the article of any one of aspects 13-20 is provided, wherein the protective film comprises an optical transmittance of 50% or more in the visible spectrum, and further wherein the film comprises a hardness of greater than 14 GPa at an indentation depth of 100 nm to 500 nm, as measured by a Berkovich nanoindenter, and a strain-to-failure of greater than 1%, as measured by a ring-on-ring test.

According to a twenty-second aspect, the article of any one of aspects 13-21 is provided, wherein the protective film further comprises a compressive film stress of greater than 50 MPa.

According to a twenty-third aspect, the article of any one of aspects 13-22 is provided, wherein the protective film comprises a hardness of greater than 16 GPa at an indentation depth of 100 nm to 500 nm, as measured by a Berkovich nanoindenter, and a strain-to-failure of greater than 1.6%, as measured by a ring-on-ring test.

According to a twenty-fourth aspect, the article of any one of aspects 13-23 is provided, wherein the protective film further comprises a fracture toughness of greater than 1 MPa·m$^{1/2}$.

According to a twenty-fifth aspect, a consumer electronic product is provided that includes: a housing that includes a front surface, a back surface and side surfaces; electrical components that are at least partially inside the housing; and a display at or adjacent to the front surface of the housing. Further, the article of any one of aspects 1-24 is at least one of disposed over the display and disposed as a portion of the housing.

According to a twenty-sixth aspect, a vehicle display system is provided that includes: a housing that includes a front surface, a back surface and side surfaces; electrical components that are at least partially inside the housing; and a display at or adjacent to the front surface of the housing. Further, the article of any one of aspects 1-24 is at least one of disposed over the display and disposed as a portion of the housing.

BRIEF DESCRIPTION OF THE DRAWINGS

These and other features, aspects and advantages of the present disclosure are better understood when the following detailed description of the disclosure is read with reference to the accompanying drawings, in which.

DETAILED DESCRIPTION

Figure 1:
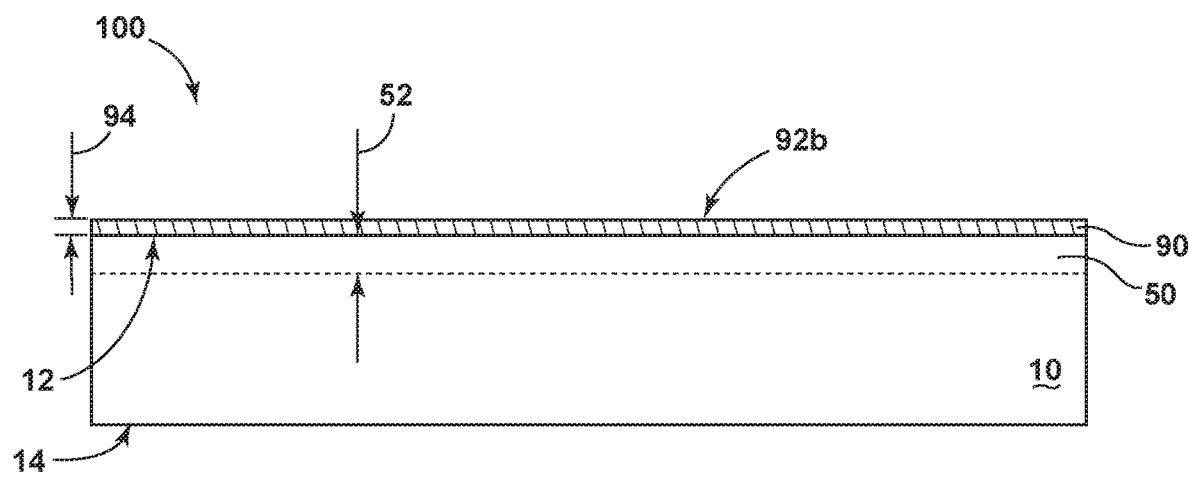
FIG. 1 is a cross-sectional, schematic view of an article comprising a glass, glass-ceramic or ceramic substrate with a protective film disposed over the substrate, according to some embodiments of the disclosure.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Directional terms as used herein—for example up, down, right, left, front, back, top, bottom-are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow;

plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes embodiments having two or more such components, unless the context clearly indicates otherwise.

Embodiments of the disclosure generally pertain to articles having glass, glass-ceramic and ceramic substrates with protective films, preferably transparent protective films having a combination of high hardness and toughness. For example, the protective films can be disposed on one or more primary surfaces of these substrates and are generally characterized by substantial transparency, e.g., an optical transmittance of 20% or more in the visible spectrum. These protective films can also be characterized by a high hardness, e.g., greater than 10 GPa, and a high toughness, e.g., a strain-to-failure of greater than 0.8%. The disclosure is also directed to articles having a glass substrate with a compressive stress region, and a protective film disposed on one or more of primary surfaces of the substrate.

Referring to FIG. 1, an article 100 is depicted that includes a substrate 10 comprising a glass, glass-ceramic or ceramic composition. That is, the substrate 10 may include one or more of glass, glass-ceramic, or ceramic materials therein. The substrate 10 comprises a pair of opposing primary surfaces 12, 14. Further, the article 100 includes a protective film 90 with an outer surface 92b disposed over the primary surface 12. As also shown in FIG. 1, the protective film 90 has a thickness 94. In embodiments, the article 100 can include one or more protective films 90 disposed over one or more primary surfaces 12, 14 of the substrate 10. As shown in FIG. 1, one or more of the films 90 are disposed over the primary surface 12 of the substrate 10. According to some implementations, the protective film or films 90 can also be disposed over the primary surface 14 of the substrate 10.

According to some implementations, the article 100 depicted in FIG. 1 includes a substrate 10 that comprises a glass, glass-ceramic or a ceramic composition and a primary surface 12, 14; and a protective film 90 disposed on the primary surface 12, 14. Each of the substrate 10 and the film 90 comprises an optical transmittance of 20% or more in the visible spectrum. Further, the protective film 90 comprises a hardness of greater than 10 GPa, as measured by a Berkovich nanoindenter, and a strain-to-failure of greater than 0.8%, as measured by a ring-on-ring test.

According to other implementations, the article 100 depicted in FIG. 1 includes a substrate 10 having a glass composition, comprising a primary surface 12, 14 and a compressive stress region 50. As shown, the compressive stress region 50 extends from the primary surface 12 to a first selected depth 52 in the substrate; nevertheless, some embodiments include a comparable compressive stress region 50 that extends from the primary surface 14 to a second selected depth (not shown). The article 100 also includes a protective film 90 disposed on the primary surface 12. Each of the substrate 10 and the film 90 comprises an optical transmittance of 20% or more in the visible spectrum. Further, the protective film 90 comprises a hardness of greater than 10 GPa, as measured by a Berkovich nanoindenter, and a strain-to-failure of greater than 0.8%, as measured by a ring-on-ring test.

In some embodiments of the article 100, as depicted in FIG. 1, the substrate 10 comprises a glass composition. The substrate 10, for example, can comprise a borosilicate glass, an aluminosilicate glass, soda-lime glass, chemically strengthened borosilicate glass, chemically strengthened aluminosilicate glass, and chemically strengthened soda-lime glass. In some embodiments, the glass may be alkali-free. The substrate may have a selected length and width, or diameter, to define its surface area. The substrate may have at least one edge between the primary surfaces 12, 14 of the substrate 10 defined by its length and width, or diameter. The substrate 10 may also have a selected thickness. In some embodiments, the substrate has a thickness of from about 0.2 mm to about 1.5 mm, from about 0.2 mm to about 1.3 mm, and from about 0.2 mm to about 1.0 mm. In other embodiments, the substrate has a thickness of from about 0.1 mm to about 1.5 mm, from about 0.1 mm to about 1.3 mm, or from about 0.1 mm to about 1.0 mm.

According to some embodiments of the article 100, the substrate 10 comprises a compressive stress region 50 (see FIG. 1) that extends from at least one of the primary surfaces 12, 14 to a selected depth 52. As used herein, a "selected depth," (e.g., selected depth 52) "depth of compression" and "DOC" are used interchangeably to define the depth at which the stress in the chemically strengthened alkali aluminosilicate glass article described herein changes from compressive to tensile. DOC may be measured by a surface stress meter, such as an FSM-6000, or a scattered light polariscope (SCALP) depending on the ion exchange treatment. Where the stress in the glass article is generated by exchanging potassium ions into the glass article, a surface stress meter is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by a surface stress meter. As also used herein, the "maximum compressive stress" is defined as the maximum compressive stress within the compressive stress region 50 in the substrate 10. In some embodiments, the maximum compressive stress is obtained at or in close proximity to the one or more primary surfaces 12, 14 defining the compressive stress region 50. In other embodiments, the maximum compressive stress is obtained between the one or more primary surfaces 12, 14 and the selected depth 52 of the compressive stress region 50.

In some implementations of the article 100, as depicted in exemplary form in FIG. 1, the substrate 10 is selected from a chemically strengthened aluminosilicate glass. In other embodiments, the substrate 10 is selected from chemically strengthened aluminosilicate glass having a compressive stress region 50 extending to a first selected depth 52 of greater than 10 μm, with a maximum compressive stress of greater than 150 MPa. In further embodiments, the substrate 10 is selected from a chemically strengthened aluminosilicate glass having a compressive stress region 50 extending to a first selected depth 52 of greater than 25 μm, with a maximum compressive stress of greater than 400 MPa. The substrate 10 of the article 100 may also include one or more compressive stress regions 50 that extend from one or more of the primary surfaces 12, 14 to a selected depth 52 (or depths) having a maximum compressive stress of greater than about 150 MPa, greater than 200 MPa, greater than 250 MPa, greater than 300 MPa, greater than 350 MPa, greater than 400 MPa, greater than 450 MPa, greater than 500 MPa, greater than 550 MPa, greater than 600 MPa, greater than 650 MPa, greater than 700 MPa, greater than 750 MPa, greater than 800 MPa, greater than 850 MPa, greater than 900 MPa, greater than 950 MPa, greater than 1000 MPa, and all maximum compressive stress levels between these values. In some embodiments, the maximum compressive stress is 2000 MPa or lower. In addition, the depth of compression (DOC) or first selected depth 52 can be set at 10 μm or greater, 15 μm or greater, 20 μm or greater, 25 μm or greater, 30 μm or greater, 35 μm or greater, and to even higher depths, depending on the thickness of the substrate 10 and the processing conditions associated with generating the compressive stress region 50. In some embodiments, the DOC is less than or equal to 0.3 time the thickness (t) of the substrate 50, for example 0.3 t, 0.28 t, 0.26 t, 0.25 t, 0.24 t, 0.23 t, 0.22 t, 0.21 t, 0.20 t, 0.19 t, 0.18 t, 0.15 t, or 0.1 t. Compressive stress, including surface compressive stress (CS) levels, is measured by a surface stress meter using commercially available instruments such as the FSM-6000 (i.e., an FSM), as manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

Similarly, with respect to glass-ceramics, the material chosen for the substrate 10 of the article 100 can be any of a wide range of materials having both a glassy phase and a ceramic phase. Illustrative glass-ceramics include those materials where the glass phase is formed from a silicate, borosilicate, aluminosilicate, or boroaluminosilicate, and the ceramic phase is formed from β-spodumene, β-quartz, nepheline, kalsilite, or carnegieite. "Glass-ceramics" include materials produced through controlled crystallization of glass. In embodiments, glass-ceramics have about 30% to about 90% crystallinity. Examples of suitable glass-ceramics may include $Li_2O$—$Al_2O_3$—$SiO_2$ system (i.e. LAS-System) glass-ceramics, MgO—$Al_2O_3$—$SiO_2$ system (i.e. MAS-System) glass-ceramics, $ZnO \times Al_2O_3 \times nSiO_2$ (i.e. ZAS system), and/or glass-ceramics that include a predominant crystal phase including β-quartz solid solution, β-spodumene, cordierite, and lithium disilicate. The glass-ceramic substrates may be strengthened using the chemical strengthening processes disclosed herein. In one or more embodiments, MAS-System glass-ceramic substrates may be strengthened in $Li_2SO_4$ molten salt, whereby an exchange of $2Li^+$ for $Mg^{2+}$ can occur.

With respect to ceramics, the material chosen for the substrate 10 of the article 100 can be any of a wide range of inorganic crystalline oxides, nitrides, carbides, oxynitrides, carbonitrides, and/or the like. Illustrative ceramics include those materials having an alumina, aluminum titanate, mullite, cordierite, zircon, spinel, persovskite, zirconia, ceria, silicon carbide, silicon nitride, silicon aluminum oxynitride or zeolite phase.

In some implementations of the article 100 depicted in FIG. 1, the protective film 90 comprises an inorganic material, preferably an inorganic material that is polycrystalline or semi-polycrystalline. Typically, these polycrystalline and semi-polycrystalline materials have a higher fracture toughness than purely amorphous materials (e.g., glass films) due to the ability of the grain boundaries to defect cracks and increase the energy for crack growth in the direction of principal stress. In some embodiments, the average crystallite size of the protective film 90 can be less than 1 micron, less than 0.9 microns, less than 0.8 microns, less than 0.7 microns, less than 0.6 microns, less than 0.5 microns, less than 0.4 microns, less than 0.3 microns, less than 0.2 microns, and all average crystallite upper limits within these values. In certain implementations, the protective film 90 can include aluminum nitride, aluminum oxynitride, alumina, spinel, mullite, zirconia-toughened alumina, zirconia, stabilized zirconia, and partially-stabilized zirconia. For those embodiments comprising nitrides and oxynitrides, the protective film 90 can include AlN, $AlO_xN_y$, $SiO_xN_y$, and $Si_uAl_xO_yN_z$.

As understood by those with ordinary skill in the field of the disclosure with regard to any of the foregoing materials (e.g., AlN) for the protective film 90, each of the subscripts, "u," "x," "y," and "z," can vary from 0 to 1, the sum of the subscripts will be less than or equal to 1, and the balance of the composition is the first element in the material (e.g., Si or Al). In addition, those with ordinary skill in the field can recognize that "$Si_uAl_xO_yN_z$" can be configured such that "u" equals zero and the material can be described as "$AlO_xN_y$". Still further, the foregoing compositions for the protective film 90 exclude a combination of subscripts that would result in a pure elemental form (e.g., pure silicon, pure aluminum metal, oxygen gas, etc.). Finally, those with ordinary skill in the art will also recognize that the foregoing compositions may include other elements not expressly denoted (e.g., hydrogen), which can result in non-stoichiometric compositions (e.g., $SiN_x$ vs. $Si_3N_4$). Accordingly, the foregoing materials for the optical film can be indicative of the available space within a $SiO_2$—$Al_2O_3$—$SiN^x$—AlN or a $SiO_2$—$Al_2O_3$—$Si_3N_4$—AlN phase diagram, depending on the values of the subscripts in the foregoing composition representations.

As used herein, the "$AlO_xN_y$," "$SiO_xN_y$," and "$Si_uAl_xO_yN_z$" materials in the disclosure include various aluminum oxynitride, silicon oxynitride and silicon aluminum oxynitride materials, as understood by those with ordinary skill in the field of the disclosure, described according to certain numerical values and ranges for the subscripts, "u," "x," "y," and "z". That is, it is common to describe solids with "whole number formula" descriptions, such as $Al_2O_3$. It is also common to describe solids using an equivalent "atomic fraction formula" description such as $Al_{0.4}O_{0.6}$, which is equivalent to $Al_2O_3$. In the atomic fraction formula, the sum of all atoms in the formula is 0.4+0.6=1, and the atomic fractions of Al and O in the formula are 0.4 and 0.6, respectively. Atomic fraction descriptions are described in many general textbooks and atomic fraction descriptions are often used to describe alloys. (See, e.g.: (i) Charles Kittel, "Introduction to Solid State Physics," seventh edition, John Wiley & Sons, Inc., N.Y., 1996, pp. 611-627; (ii) Smart and Moore, "Solid State Chemistry, An Introduction," Chapman & Hall University and Professional Division, London, 1992, pp. 136-151; and (iii) James F. Shackelford, "Introduction to Materials Science for Engineers," Sixth Edition, Pearson Prentice Hall, New Jersey, 2005, pp. 404-418.)

Again referring to the "$AlO_xN_y$," "$SiO_xN_y$," and "$Si_uAl_xO_yN_z$" materials in the disclosure, the subscripts allow those with ordinary skill in the art to reference these materials as a class of materials without specifying particular subscript values. That is, to speak generally about an alloy, such as aluminum oxide, without specifying the particular subscript values, we can speak of $Al_vO_x$. The description $Al_vO_x$ can represent either $Al_2O_3$ or $Al^{0.4}O_{0.6}$. If v+x were chosen to sum to 1 (i.e. v+x=1), then the formula would be an atomic fraction description. Similarly, more complicated mixtures can be described, such as $Si_uAl_vO_xN_y$, where again, if the sum u+v+x+y were equal to 1, we would have the atomic fractions description case.

Once again referring to the "$AlO_xN_y$," "$SiO_xN_y$," and "$Si_uAl_xO_yN_z$" materials in the disclosure, these notations allow those with ordinary skill in the art to readily make comparisons to these materials and others. That is, atomic fraction formulas are sometimes easier to use in comparisons. For instance; an example alloy consisting of $(Al_2O_3)_{0.3}(AlN)_{0.7}$ is closely equivalent to the formula descriptions $Al_{0.448}O_{0.31}N_{0.241}$ and also $Al_{367}O_{254}N_{198}$. Another example alloy consisting of $(Al_2O_3)^{0.4}(AlN)^{0.6}$ is closely equivalent to the formula descriptions $Al_{0.438}O_{0.375}N_{0.188}$ and $Al_{37}O_{32}N_{16}$. The atomic fraction formulas $Al_{0.448}O_{0.31}N_{0.241}$ and $Al_{0.438}O_{0.375}N_{0.188}$ are relatively easy to compare to one another. For instance, Al decreased in atomic fraction by 0.01, O increased in atomic fraction by 0.065 and N decreased in atomic fraction by 0.053. It takes more detailed calculation and consideration to compare the whole number formula descriptions $Al_{367}O_{254}N_{198}$ and $Al_{37}O_{32}N_{16}$. Therefore, it is sometimes preferable to use atomic fraction formula descriptions of solids. Nonetheless, the use of $Al_vO_xN_y$ is general since it captures any alloy containing Al, O and N atoms.

As noted earlier, the protective film 90 of the article 100 depicted in FIG. 1 can include an inorganic material that is polycrystalline or semi-polycrystalline. In some implementations of these protective films 90, the inorganic material comprises a substantially isotropic, non-columnar microstructure. That is, the crystallites of the protective film 90 are isotropic or near-isotropic in their shape and/or orientation with regard to one another. In some embodiments, a substantially-isotropic microstructure can be obtained by a high power impulse magnetron sputtering ("HiPIMS") process at deposition temperatures of 600° C. and lower. HiPIMS process parameters include, but are not limited to, sputtering power, temperature, composition, chamber pressure, chamber process gases and substrate voltage bias to achieve a desirable combination of high hardness and toughness in the protective film 90 having a substantially isotropic microstructure.

In some embodiments, the protective film 90 comprises a ytria-stabilized tetragonal zirconia polycrystalline ("Y-TZP") material. Such films 90 deposited over a primary surface 12, 14 of a substrate 10 are believed to be suitable for processing with a HiPIMS process. In some implementations, the Y-TZP material can comprise about 1 to 8 mol % yttria and greater than 1 mol % of tetragonal zirconia. It should also be understood that the remainder of the film 90 can include other phases of zirconia, including monoclinic and cubic, amorphous zirconia, and/or other materials such as alumina. Upon the application of stress to the protective film 90 having such compositions, the crystal structure can change from tetragonal to monoclinic, which results in a volumetric expansion that can arrest the development of cracks and/or mitigate the propagation of any pre-existing flaws and cracks. The net result is a protective film 90 with a high toughness borne through a transformation-toughening mechanism. In other similar embodiments of these protective films 90, the tetragonal crystal structure can be stabilized by ceria, at compositions understood by those with ordinary skill to achieve the desired toughening without detriment to hardness, along with optical properties.

According to some embodiments of the protective film 90, the relationship between the thickness 94 and its average crystallite size can be controlled to enhance the toughening of these films. In particular, the ratio of the thickness 94 of the film 90 to the average crystallite size can be 4× or greater, 5× or greater, 10× or greater, 20× or greater, or even 50× or greater, but less than about 10,000×. A protective film 90 having a thickness 94 of 2 microns, for example, could be characterized by an average crystallite size of 500 nm or less, 200 nm or less, 100 nm or less, or even 50 nm or less, but greater than 1 nm. In other embodiments, the protective film 90 can have a greater thickness 94, such as 5 microns thick or 10 microns thick or 20 microns thick or 50 microns thick films, or thinner protective films 90, such as a thickness 94 of 1 micron or 0.5 microns.

In other implementations of the article 100 depicted in FIG. 1, the protective film 90 can include one or more energy-absorbing compositions with numerous microstructural defects (e.g., as defects intentionally developed within the film or stemming from the microstructure of the film). In some embodiments, the energy-absorbing material can be selected from the group consisting of yttrium disilicate, boron suboxide, titanium silicon carbide, quartz, feldspar, amphibole, kyanite and pyroxene. The microstructural defects can facilitate plastic deformation of the film 90 upon the application of stress. In some embodiments, the microstructure defects include but are not limited to shear bands, kink bands, dislocations, and other micro- and nano-scale defects. For example, shear bands can be formed by plastic deformation along a crystallographic slip system to result in a twinned region, and can be observed in ceramics such as yttrium disilicate, and cermets such as boron suboxide and titanium silicon carbide. Kink bands can be formed when plastic deformation does not occur along crystallographic planes and are common in metamorphic rock materials, e.g., quartz, feldspar, amphibole, kyanite and pyroxenes.

The source materials of the protective film 90 may be deposited as a single layer film or a multilayer film, coating or structure. More generally, the protective film 90, whether in a single film or a multilayer structure, can be characterized by a selected thickness, i.e., thickness 94 (see FIG. 1). In some embodiments, the thickness 94 of a single layer or multilayer protective film 90 may be greater than or equal to 50 nm, 75 nm, 100 nm, 125 nm, 150 nm, 175 nm, 200 nm, or even greater lower thickness limits. In some embodiments, the thickness 94 of the single layer or multilayer protective film 90 may be less than or equal to 50,000 nm, 20,000 nm, 10,000 nm, 9,000 nm, 8,000 nm, 7,000 nm, 6,000 nm, 5,000 nm, 4,000 nm, 3,000 nm, 2000 nm, 1500 nm, 1000 nm, 500 nm, 250 nm, 150 nm or 100 nm. In further embodiments, the thickness 94 of the single layer or multilayer protective film 90 may be between about 200 nm and 50,000 nm, between about 200 nm and 20,000 nm, between about 200 nm and about 10,000 nm, between about 200 nm and about 5,000 nm, between about 200 nm and 2,000 nm, and all thickness values between these thicknesses. As understood by those with ordinary skill in the field of the disclosure, the thickness of the protective film 90 as reported herein was contemplated as being measured by scanning electron microscope (SEM) of a cross-section, by optical ellipsometry (e.g., by an n & k analyzer), or by thin film reflectometry. For multiple layer elements (e.g., a stack of layers), thickness measurements by SEM are preferred.

The protective film 90, as present in the article 100, can be deposited using a variety of methods including physical vapor deposition ("PVD"), electron beam deposition ("e-beam" or "EB"), ion-assisted deposition-EB ("IAD-EB"), laser ablation, vacuum arc deposition, thermal evaporation, sputtering, plasma enhanced chemical vapor deposition (PECVD) and other similar deposition techniques.

According to some embodiments, the article 100 depicted in FIG. 1 employs a protective film 90 with an average hardness of 10 GPa or more. In some embodiments, the average hardness of these films can be about 10 GPa or more, 11 GPa, or more, 12 GPa or more, 13 GPa or more, 14 GPa or more, 15 GPa or more, 16 GPa or more, 17 GPa or more, 18 GPa or more, 19 GPa or more, and all average hardness values between these values. As used herein, the "average hardness value" is reported as an average of a set of measurements on the outer surface 92b of the protective film 90 using a nanoindentation apparatus. More particularly, hardness of thin film coatings as reported herein was determined using widely accepted nanoindentation practices. (See Fischer-Cripps, A. C., Critical Review of Analysis and Interpretation of Nanoindentation Test Data, Surface & Coatings Technology, 200, 4153-4165 (2006) (hereinafter "Fischer-Cripps"); and Hay, J., Agee, P., and Herbert, E., Continuous Stiffness measurement During Instrumented Indentation Testing, Experimental Techniques, 34 (3) 86-94 (2010) (hereinafter "Hay").) For coatings, it is typical to measure hardness as a function of indentation depth. So long as the coating is of sufficient thickness, it is then possible to isolate the properties of the coating from the resulting response profiles. It should be recognized that if the coatings are too thin (for example, less than ~500 nm), it may not be possible to completely isolate the coating properties as they can be influenced from the proximity of the substrate which may have different mechanical properties. (See Hay.) The methods used to report the properties herein are representative of the coatings themselves. The process is to measure hardness and modulus versus indentation depth out to depths approaching 1000 nm. In the case of hard coatings on a softer glass, the response curves will reveal maximum levels of hardness and modulus at relatively small indentation depths (less than or equal to about 200 nm). At deeper indentation depths, both hardness and modulus will gradually diminish as the response is influenced by the softer glass substrate. In this case, the coating hardness and modulus are taken be those associated with the regions exhibiting the maximum hardness and modulus. At deeper indentation depths, the hardness and modulus will gradually increase due to the influence of the harder glass. These profiles of hardness and modulus versus depth can be obtained using either the traditional Oliver and Pharr approach (as described in Fischer-Cripps), or by the more efficient continuous stiffness approach (see Hay). The elastic modulus and hardness values reported herein for such thin films were measured using known diamond nanoindentation methods, as described above, with a Berkovich diamond indenter tip.

In some embodiments of the article 100 depicted in FIG. 1, the protective film 90 is characterized by a compressive film stress of greater than 50 MPa, greater than 75 MPa, greater than 100 MPa, greater than 125 MPa, greater than 150 MPa, and allow lower limits of the compressive film stress between these values. In some embodiments, the compressive film stress of the protective film 90 can range from about 50 MPa to about 400 MPa, from about 50 MPa to about 200 MPa, or from about 75 MPa to about 175 MPa. In some embodiments, the CS is 2000 MPa or less.

In some embodiments of the article 100 depicted in FIG. 1, the protective film 90 is characterized by a fracture toughness of greater than about 1 MPa·m$^{1/2}$, greater than about 2 MPa·m$^{1/2}$, greater than about 3 MPa·m$^{1/2}$, greater than about 4 MPa·m$^{1/2}$, or even greater than about 5 MPa·m$^{1/2}$. Fracture toughness of thin films is measured as described in D. S Harding, W. C. Oliver, and G. M. Pharr, "Cracking During Nanoindentation and its Use in the Measurement of Fracture Toughness," Mat. Res. Soc. Symp. Proc., vol. 356, 1995, 663-668. The toughness of the protective film 90 can also be manifested in high strain-to-failure values, in some implementations. For example, the protective film 90 can be characterized by strain-to-failure of greater than 0.8%, 0.9%, 1.0%, 1.1%, 1.2%, 1.3%, 1.4%, 1.5%, 1.6%, 1.7%, 1.8%, 1.9%, or 2.0%, but no greater than 10%, all as measured by a ring-on-ring test.

As used herein, a "ring-on-ring" test uses the following procedure for measuring load-to-failure, failure strength, and strain-to-failure values. An article (e.g., the article 100) is positioned between the bottom ring and the top ring of a ring-on-ring mechanical testing device. The top ring and the bottom ring have different diameters. As used herein, the top ring has a diameter of 12.7 mm and the bottom ring has a diameter of 25.4 mm. The portion of the top ring and bottom ring which contact the article 100 and protective film 90 are circular in cross section and each have a radius of 1.6 mm. The top ring and bottom ring are made of steel. Testing is performed in an environment of about 22° C. with 45%-55% relative humidity. The articles used for testing are 50 mm by 50 mm squares in size.

To determine the strain-to-failure of the article 100 and/or the protective film 90, force is applied to the top ring in a downward direction and/or to the bottom ring in an upward direction, using a loading/cross-head speed of 1.2 mm/minute. The force on the top ring and/or the bottom ring is increased, causing strain in the article 100 until catastrophic failure of one or both of the substrate 10 and the film 90. A light and camera are provided below the bottom ring to record the catastrophic failure during testing. An electronic controller, such as a Dewetron acquisition system, is provided to coordinate the camera images with the applied load to determine the load when catastrophic damage is observed by the camera. To determine the strain-to-failure, camera images and load signals are synchronized through the Dewetron system, so that the load at which the protective film 90 shows failure can be determined. The load-to-failure of the article 100 can also be recorded using stress or strain gauges rather than this camera system, though the camera system is typically preferred for independently measuring the failure levels of the film 90. Finite element analysis, as found in Hu, G., et al., "Dynamic fracturing of strengthened glass under biaxial tensile loading," Journal of Non-Crystalline Solids, 2014. 405(0): p. 153-158, is used to analyze the strain levels the sample is experiencing at this load. The element size may be chosen to be fine enough to be representative of the stress concentration underneath the loading ring. The strain level is averaged over 30 nodal points or more underneath the loading ring. According to other implementations, the article 100 may have a Weibull characteristic load-to-failure greater than about 200 kgf, greater than 250 kgf, or even greater than 300 kgf, for a 0.7 mm thick article 100 measured in a ring-on-ring testing procedure. In these ring-on-ring tests, the side of the substrate 10 with the protective film 90 is placed in tension and, typically, this is the side that fails.

In addition to average load, stress (strength), and strain-to-failure, a Weibull characteristic load, stress, or strain-to-failure may be calculated. The Weibull characteristic load to failure (also called the Weibull scale parameter) is the load level at which a brittle material's failure probability is 63.2%, calculated using known statistical methods. Using these load-to-failure values, sample geometry, and numerical analysis of the ring-on-ring test setup and geometry described above, a Weibull characteristic strain-to-failure value can be calculated for the article 100 of greater than 0.8%, greater than 1%, or even greater than 1.2% and/or a Weibull characteristic strength (stress at failure) value greater than 600 MPa, 800 MPa, or 1000 MPa. As recognized by those with ordinary skill in the field of the disclosure, strain-to-failure and Weibull characteristic strength values, as compared to failure load values, can apply more broadly to different variations of the article 100, e.g., as varied with regard to substrate thickness, shape, and/or different loading or testing geometries. Without being bound by theory, the articles 100 may further comprise a Weibull modulus (i.e., a Weibull 'shape factor', or slope of a Weibull plot for samples loaded up to failure, using failure load, failure strain, failure stress, or more than one of these metrics) of greater than about 3.0, greater than 4.0, greater than 5.0, greater than 8.0, or even greater than 10, all as measured by a ring-on-ring flexural test. Finite element analysis as described above is used to analyze the strain levels the article 100 is experiencing at the failure load, and the failure strain levels can then be translated to failure stress (i.e., strength) values using the known relationship strain=stress×elastic modulus.

As used herein, the terms "strain-to-failure" and "average strain-to-failure" refer to the strain at which cracks propagate without application of additional load, typically leading to optically visible failure in a given material, layer or film and, perhaps even bridge to another material, layer, or film, as defined herein. Strain-to-failure values may be measured using, for example, ring-on-ring testing.

According to some embodiments of the article 100 depicted in FIG. 1, the protective film 90 is transparent or substantially transparent. In some preferred embodiments, the protective film 90 is characterized by an optical transmittance within the visible spectrum of greater than 50%, greater than 60%, greater than 70%, greater than 80%, greater than 90%, and all values between these lower limit transmittance levels. In other implementations, the protective film can be characterized by an optical transmittance in the visible spectrum of greater than 20%, greater than 30%, greater than 40%, greater than 50%, greater than 60%, greater than 70%, greater than 80%, greater than 90%, and all values between these lower limit transmittance levels.

In embodiments, the article 100 depicted in FIG. 1 can comprise a haze through the protective film 90 and the glass, glass-ceramic or ceramic substrate 10 of less than or equal to about 5 percent. In certain aspects, the haze is equal to or less than 5 percent, 4.5 percent, 4 percent, 3.5 percent, 3 percent, 2.5 percent, 2 percent, 1.5 percent, 1 percent, 0.75 percent, 0.5 percent, or 0.25 percent (including all levels of haze between these levels) through the protective film 90 and the substrate 10. The measured haze may be as low as zero. As used herein, the "haze" attributes and measurements reported in the disclosure are as measured on, or otherwise based on measurements from, a BYK-Gardner haze meter.

In some embodiments of the article 100 depicted in FIG. 1, the protective film 90 can comprise a durable and scratch resistant optical coating (not shown) having controlled optical properties, including reflectance, transmittance, and color. In these configurations, the optical coating of the protective film 90 can comprise a multilayer interference stack, the multilayer interference stack having an outer surface opposite the primary surface 12 of the substrate 10. These articles 100 can exhibit a single side average photopic light reflectance (i.e., as measured at the outer surface at near normal incidence) of about 10% or less over an optical wavelength regime in the range from about 400 nm to about 700 nm. The single sided reflectance may be 9% or less, 8% or less, 7% or less, 6% or less, 5% or less, 4% or less, 3% or less, or 2% or less. The single sided reflectance may be as low as 0.1%. These articles 100 may also exhibit reflectance color coordinates in the (L*, a*, b*) colorimetry system for all incidence angles from 0 to 10 degrees, 0 to 20 degrees, 0 to 30 degrees, 0 to 60 degrees, or 0 to 90 degrees under an International Commission on Illumination illuminant that are indicative of a reference point color shift of less than about 12 from a reference point as measured at the outer surface of the optical coating of the protective film 90. As used herein, the "reference point" includes at least one of the color coordinates (a*=0, b*=0) and the reflectance color coordinates of the substrate 10. When the reference point is defined as the color coordinates (a*=0, b*=0), the color shift is defined by $\sqrt{((a^*_{article})^2+(b^*_{article})^2)}$. When the reference point is defined by the color coordinates of the substrate 10, the color shift is defined by $\sqrt{(a^*_{article}-rt_{substrate})^2+(b^*_{article}-rt_{substrate})^2)}$. Accordingly, the color shift of the foregoing articles 100 from a reference point can be less than about 12, less than about 10, less than about 8, less than about 6, less than about 4, or less than about 2.

Figure 2A:
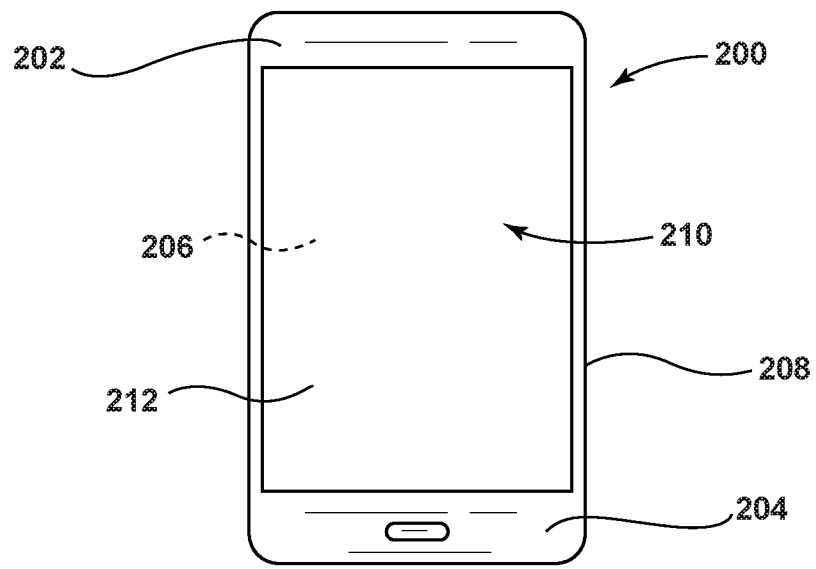
FIG. 2A is a plan view of an exemplary electronic device incorporating any of the articles disclosed herein.
Figure 2B:
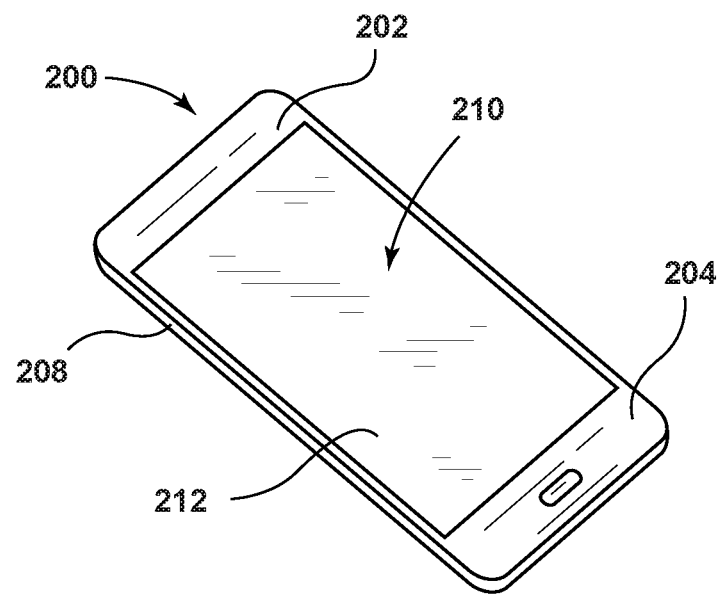
FIG. 2B is a perspective view of the exemplary electronic device of FIG. 2A.

The articles 100 disclosed herein may be incorporated into a device article such as a device article with a display (or display device articles) (e.g., consumer electronics, including mobile phones, tablets, computers, navigation systems, wearable devices (e.g., watches) and the like), augmented-reality displays, heads-up displays, glasses-based displays, architectural device articles, transportation device articles (e.g., automotive, trains, aircraft, sea craft, etc.), appliance device articles, or any device article that benefits from some transparency, scratch-resistance, abrasion resistance or a combination thereof. An exemplary device article incorporating any of the articles disclosed herein (e.g., as consistent with the articles 100 depicted in FIG. 1) is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, the cover substrate 212 may include any of the articles disclosed herein. In some embodiments, at least one of a portion of the housing or the cover glass comprises the articles disclosed herein.

Figure 3:
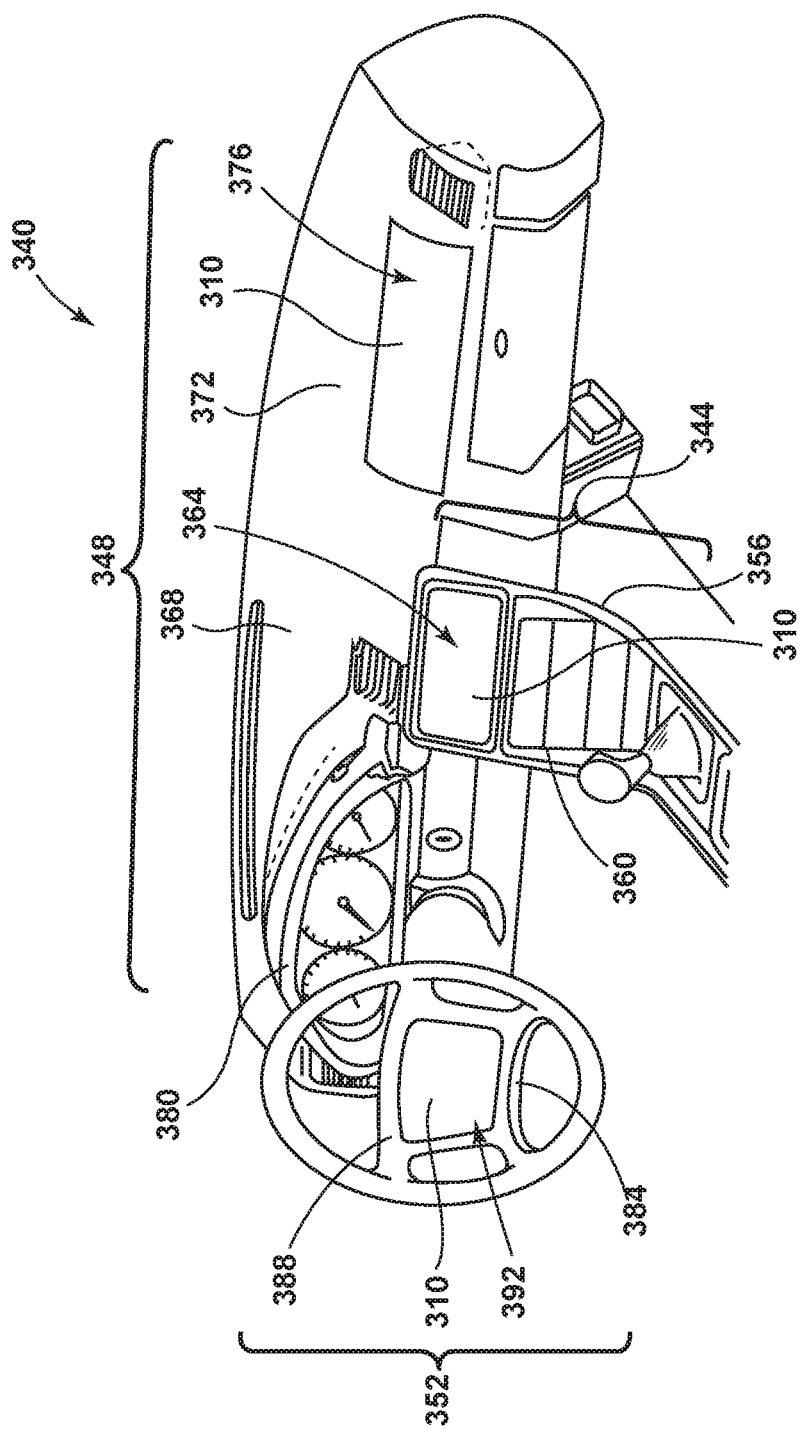
FIG. 3 is a perspective view of a vehicle interior with vehicular interior systems that may incorporate any of the articles disclosed herein.

According to some embodiments, the articles 100 may be incorporated within a vehicle interior with vehicular interior systems, as depicted in FIG. 3. More particularly, the article 100 (see FIG. 1) may be used in conjunction with a variety of vehicle interior systems. A vehicle interior 340 is depicted that includes three different examples of a vehicle interior system 344, 348, 352. Vehicle interior system 344 includes a center console base 356 with a surface 360 including a display 364. Vehicle interior system 348 includes a dashboard base 368 with a surface 372 including a display 376. The dashboard base 368 typically includes an instrument panel 380 which may also include a display. Vehicle interior system 352 includes a dashboard steering wheel base 384 with a surface 388 and a display 392. In one or more examples, the vehicle interior system may include a base that is an armrest, a pillar, a seat back, a floor board, a headrest, a door panel, or any portion of the interior of a vehicle that includes a surface. It will be understood that, the article 100 described herein can be used interchangeably in each of vehicle interior systems 344, 348 and 352.

According to some embodiments, the articles 100 may be used in a passive optical element, such as a lens, windows, lighting covers, eyeglasses, or sunglasses, that may or may not be integrated with an electronic display or electrically active device.

Referring again to FIG. 3, the displays 364, 376 and 392 may each include a housing having front, back, and side surfaces. At least one electrical component is at least partially within the housing. A display element is at or adjacent to the front surface of the housings. The article 100 (see FIG. 1) is disposed over the display elements. It will be understood that the article 100 may also be used on, or in conjunction with the armrest, the pillar, the seat back, the floor board, the headrest, the door panel, or any portion of the interior of a vehicle that includes a surface as explained above. According to various examples, the displays 364, 376 and 392 may be a vehicle visual display system or vehicle infotainment system. It will be understood that the article 100 may be incorporated in a variety of displays and structural components of autonomous vehicles and that the description provided herein with relation to conventional vehicles is not limiting.

Example 1

As described herein, reactive sputtering may be used to fabricate $ZrO_2$-based films having a predetermined combination of hardness, effective toughness, refractive index, optical absorption (i.e., extinction coefficient), and film stress for use as components of multilayer optical films, including anti-reflective multilayer films and other types of interference films (e.g. dielectric mirror films, IR blocking films, UV blocking films, wavelength-selective bandpass or notch filters) with high mechanical durability.

As used herein, "$ZrO_2$-based" films may comprise greater than 80% $ZrO_2$ by molarity or by volume. Moreover, $ZrO_2$-based films may also optionally include partially stabilized or stabilized zirconia. Finally, $ZrO_2$-based films may also include additives or dopants such as $Al_2O_3$, $Y_2O_3$, and the like, or stabilizing agents such as Ce, La, Sr, Mn, Ca, and the like.

In other words, coatings combining high hardness and high toughness may have greater resistance to multiple different modes of scratch, abrasion, frictive, impact, and contact damage than coatings having high hardness alone. In addition, coatings with higher toughness can tolerate higher strain, thereby allowing greater flexure, for example, when used on flexible substrates.

In some examples, the coating described herein may be formed on a transparent substrate (e.g., sapphire, polymer, glass, or chemically-strengthened glass such as chemically-strengthened aluminosilicate glass or Gorilla Glass®). In some examples, the $ZrO_2$-based films may be coated on glass substrates, thin glass substrates, flexible glass substrates, or chemically-strengthened glass substrates to form optically coated durable articles. The transparent substrate may have a thickness of less than 2 mm, or less than 1 mm, or less than 0.7 mm, or less than 0.5 mm, or less than 0.3 mm, or less than 0.25 mm, or less than 0.1 mm.

Table 1 describes properties of $ZrO_2$ and comparative films.

|  | Material | Coating thickness (μm) | Refractive index (n) at 550 nm | Extinction coefficient (k) at 400 nm | Film Stress (Mpa) | Nano-indentation hardness (H) (Gpa) | Elastic modulus (E) (Gpa) | Effective toughness (Kc) (Mpa√m) | Coating crack onset strain (%) | Coating failure stress (MPa) |
|---|---|---|---|---|---|---|---|---|---|---|
| Comparative | Chemically-strengthened aluminosilicate glass | none | 1.51 |  |  | 8.2 | 71 | 1.43 |  |  |
|  | $SiO_2$ | 2.1 | 1.47 |  |  | 7.6 |  | 0.92 |  |  |
|  | $Al_2O_3$ | 1.9 | 1.65 |  |  | 11.3 |  | 2.71 |  |  |
|  | $SiO_xN_y$ | 2.1 | 1.9 |  |  | 16.8 |  | 2.06 |  |  |
|  | $AlO_xN_y$ | 1.5 | 1.95 |  |  | 19.9 | 180 | 1.44 |  |  |
|  | $Si_3N_4$ | 1.8 | 2.0 |  |  | 19.5 |  | 1.94 |  |  |
|  | $ZrO_2$:$Y_2O_3$ (97:3) | 2.2 | 1.86 | $1.1 \times 10^{-1}$ | 6 | 11.7 | 150 | 2.02 ± 0.19 |  |  |
| Examples | $ZrO_2$ | 1.12 | 2.21 | $8 \times 10^{-4}$ | −470 | 13.2 | 180 | 3.78 ± 0.08 |  |  |
|  |  | 3.7 | 2.2 | $9 \times 10^{-4}$ | −280 |  |  | 4.31 ± 0.37 |  |  |
|  |  | 2.24 | 2.2 | $1 \times 10^{-3}$ | −110 | 13.2 | 190 | 3.02 ± 0.2 |  |  |
|  |  | 2.24 | 2.2 | $8 \times 10^{-4}$ | −330 | 13.2 | 180 | 4.84 ± 0.16 |  |  |
|  |  | 1.75 | 2.2 | $3 \times 10^{-4}$ | −120 | 13.9 | 190 | 3.23 ± 0.27 |  |  |
|  |  | 2.2 | 2.2 | $2 \times 10^{-4}$ | −90 | 13.9 | 190 | 3.2 ± 0.3 | 0.72 | 1230 |

Thus, as described above, a hard-coating or a hard-coated glass article comprising: a nanoindentation hardness of greater than 10 GPa, or greater than 11 GPa, or greater than 12 GPa, or greater than 13 GPa. In some examples, the hard-coating or a hard-coated glass article comprises an effective fracture toughness (Kc) (measured by indentation fracture) of greater than 2.5, or greater than 3.0, or greater than 3.5, or greater than 4.0. In some examples, the hard-coating or a hard-coated glass article comprises a coating film stress less than (i.e., more negative than, or more highly compressive than) −50 MPa compressive stress, such as in a range of −50 MPa to −1000 MPa, or in a range of −75 MPa to −500 MPa, or in a range of −100 MPa to −400 MPa. In some examples, the hard-coating or a hard-coated glass article comprises a photopic average optical transmission in the visible range of greater than 50%, or of greater than 60%, or of greater than 70%, or of greater than 75%.

In some examples, the hard-coating or a hard-coated glass article comprises a refractive index measured at 550 nm wavelength of greater than 1.8, or greater than 1.9, or greater than 2.0, or greater than 2.1, or greater than 2.15. In some examples, the hard-coating or a hard-coated glass article comprises an optical extinction coefficient (k) measured at 400 nm wavelength of less than 0.1, or less than 0.01, or less than $5 \times 10'$, or less than $1 \times 10'$, or less than $5 \times 10^{-4}$.

In some examples, the hard-coating or a hard-coated glass article comprises a coating thickness in a range of 0.5 μm to 50 µm; or in a range of 0.5 µm to 20 µm; or in a range of 0.5 µm to 10 µm; or in a range of 1.0 µm to 5.0 µm; or in a range of 1.1 µm to 3.75 µm; or in a range of 1.5 µm to 2.5 µm. In some examples, the hard-coating or a hard-coated glass article comprises a coating strain to failure of greater than 0.5%, or of greater than 0.6%, or of greater than 0.7% for coatings having thicknesses greater than 1 µm, or greater than 2 µm, or greater than 3 µm. In some examples, the hard-coating or a hard-coated glass article comprises a coating failure stress of greater than 800 MPa, or of greater than 1000 MPa, or of greater than 1200 MPa for the same coating. In some examples, the hard-coating or a hard-coated glass article comprises a composition having greater than 80% $ZrO_2$, or greater than 90% $ZrO_2$, or greater than 95% $ZrO_2$, or greater than 98% $ZrO_2$, or greater than 99% $ZrO_2$ by molar concentration or volume. In some examples, the hard-coating or a hard-coated glass article comprises tetragonal $ZrO_2$, monoclinic $ZrO_2$, or a combination thereof. In some examples, the hard-coating or a hard-coated glass article comprises a photopic average optical absorption (measured as 100%-Reflectance-Transmittance), of less than 10%, or of less than 5%, or of less than 3%, or of less than 2%, or of less than 1%.

In some examples, the hard-coating or hard-coated glass articles may comprise multilayer optical coatings, such as those employing optical interference (e.g., anti-reflective coatings, dielectric mirror films, IR blocking films, UV blocking films, wavelength-selective bandpass, notch filters, and the like). These multilayer optical coatings may have high mechanical durability owing to the high hardness and high effective toughness of $ZrO_2$-based films described herein. In these multilayer films, high refractive index $ZrO_2$ may be combined with at least one layer of lower refractive index material (e.g., $SiO_2$, $Al_2O_3$, etc.) to achieve desired optical interference effects.

In examples where the glass articles use chemically- or thermally-strengthened glass substrates, the coated glass article may have a surface compressive stress of at least 200 MPa, or at least 400 MPa, or at least 600 MPa, or at least 800 MPa. High levels of compressive stress typically require the glass to not be processed after strengthening for prolonged time periods at temperatures approaching the strain point of the glass. In other words, $ZrO_2$ film deposition temperatures (e.g., less than 350° C., or less than 100° C., including 300C substrate temperature and nominally room temperature substrate temperatures during film depositions used in Examples) are significant to the realization of optimal strengthened glass products having the benefits of hard, tough coatings.

In some examples, the zirconia-based coatings described herein may be deposited by at least one of (1) RF sputtering from a sputtering target comprising Zr or $ZrO_2$; (2) high power impulse magnetron sputtering (HiPIMS) using a pulse on/off ratio of 10-30µ-sec 'on'0to 60-100µ-sec 'off'; (3) sputtering with oxygen gas at a partial pressure of 0.1 mTorr to 1.0 mTorr; and (4) substrate temperatures during deposition of less than 350° C., or less than 310° C., or less than 200° C., or less than 100° C., or less than 60° C.

Hardness was measured by known nano-indentation techniques; effective toughness was measured and calculated using the Lawn-Evans-Marshall model. Toughness values reported are selected from higher depths (e.g., greater than about 1 µm) to ensure a half-penny crack morphology. The effective toughness may depend on the deposited film stress. For example, higher compressive stresses may result in higher measured effective toughness; however, the controlled ranges of compressive stress applied herein are preferred in order to reduce sample warpage. In other words, film stress is kept within the disclosed ranges since overly high film stress leads to product warpage, particularly for thinner substrates. Thus, compressive stress cannot be arbitrarily increased to create a high effective toughness without creating other negative artifacts of high compressive stress. Crack onset strain and coating failure stress were measured in flexure using a ring-on-ring test setup, as described herein.

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. An article, comprising:
    a transparent substrate comprising a primary surface; and
    a protective film disposed on the primary surface,
    wherein the protective film comprises:
        (1) a hardness of greater than 13 GPa, as measured by a Berkovich nanoindenter, and
        (2) an effective fracture toughness (Kc) of greater than 2.5 MPa·m$^{1/2}$,
    wherein the protective film comprises a composition having greater than 98% $ZrO_2$ (by molar concentration or volume), and
    further wherein the protective film comprises a thickness in a range from 1.1 µm to 3.75 µm.

2. The article according to claim 1, wherein the protective film comprises a strain-to-failure of greater than 0.7%, as measured by a ring-on-ring test.

3. The article according to claim 1, wherein the protective film comprises a compressive film stress greater than 50 MPa.

4. The article according to claim 1, wherein the protective film comprises an optical transmittance of 50% or more in the visible spectrum.

5. The article according to claim 1, wherein the protective film comprises a refractive index (n) of at least 2.0, measured at 550 nm wavelength.

6. The article according to claim 1, wherein each of the substrate and the protective film comprises an optical transmittance of 20% or more in the visible spectrum.

7. The article according to claim 1, wherein the protective film comprises a coating failure stress of greater than 800 MPa.

8. The article according to claim 1, wherein the protective film comprises tetragonal $ZrO_2$, monoclinic $ZrO_2$, or a combination thereof.

9. The article according to claim 1, wherein the protective film comprises an inorganic material, wherein the material is polycrystalline or semi-polycrystalline and comprises an average crystallite size of less than 1 micron.

10. The article according to claim 1, wherein the substrate further comprises a compressive stress region, the compressive stress region extending from the primary surface to a first selected depth in the substrate.

11. The article according to claim 1, wherein the protective film comprises a multilayer optical coating selected from at least one of: anti-reflective film, dielectric mirror film, infrared blocking film, ultraviolet blocking film, wavelength-selective bandpass film, or notch filter.

12. The article according to claim 11, wherein the multilayer optical coating comprises at least one $ZrO_2$-based film having a refractive index of n1, and at least one lower refractive index material film having a refractive index of n2, wherein n1 is greater than n2.

13. The article according to claim 1, wherein the transparent substrate comprises a glass-ceramic composition.

14. A consumer electronic product, comprising:
a housing comprising front, back and side surfaces;
electrical components that are at least partially inside the housing; and
a display at or adjacent to the front surface of the housing,
wherein the article of claim 1 is at least one of disposed over the display and disposed as a portion of the housing.

15. A vehicle display system, comprising:
a housing comprising front, back and side surfaces;
electrical components that are at least partially inside the housing; and
a display at or adjacent to the front surface of the housing,
wherein the article of claim 1 is at least one of disposed over the display and disposed as a portion of the housing.

16. A device comprising the article of claim 1.

17. The device of claim 16, comprising a camera lens cover, an optical sensor cover, or an infrared (IR) sensor cover.

18. An article, comprising:
a transparent substrate comprising a primary surface; and
a protective film disposed on the primary surface,
wherein the protective film comprises:
  (1) a hardness of greater than 13 GPa, as measured by a Berkovich nanoindenter,
  (2) an effective fracture toughness (Kc) of greater than 2.5 $MPa·m^{1/2}$, and
  (3) an optical extinction coefficient (k) equal to or less than $1\times10^{-2}$, measured at 400 nm wavelength,
wherein the protective film comprises a composition having greater than 98% $ZrO_2$ (by molar concentration or volume), and
further wherein the protective film comprises a thickness in a range from 1.1 µm to 3.75 µm.

19. An article, comprising:
a transparent substrate comprising a primary surface; and
a protective film disposed on the primary surface,
wherein the protective film comprises:
  (1) an effective fracture toughness (Kc) of greater than 2.5 $MPa·m^{1/2}$, and
  (2) an optical extinction coefficient (k) equal to or less than $1\times10^{-2}$, measured at 400 nm wavelength,
wherein the protective film comprises a composition having greater than 98% $ZrO_2$ (by molar concentration or volume), and
further wherein the protective film comprises a thickness in a range from 1.1 µm to 3.75 µm.

20. The article according to claim 19, wherein the transparent substrate comprises a glass-ceramic composition.

* * * * *

UNITED STATES PATENT AND TRADEMARK OFFICE
CERTIFICATE OF CORRECTION

PATENT NO. : 11,072,558 B2
APPLICATION NO. : 16/690499
DATED : July 27, 2021
INVENTOR(S) : Bill Baloukas et al.

It is certified that error appears in the above-identified patent and that said Letters Patent is hereby corrected as shown below:

On the Title Page

In Column 2, item (56), Other Publications, Line 6, delete "(2006." and insert -- (2006). --, therefor.

On page 2, in Column 2, item (56), Other Publications, Line 2, delete "(2010." and insert -- (2010). --, therefor.

On page 2, in Column 2, item (56), Other Publications, Line 7, delete "Materiala" and insert -- Materialia --, therefor.

On page 2, in Column 2, item (56), Other Publications, Line 30, delete "Aurthority;" and insert -- Authority; --, therefor.

Signed and Sealed this
Twenty-fifth Day of July, 2023

Katherine Kelly Vidal
*Director of the United States Patent and Trademark Office*